(12) United States Patent
Newsome et al.

(10) Patent No.: US 7,247,339 B2
(45) Date of Patent: Jul. 24, 2007

(54) DEPOSITION OF SOLUBLE MATERIALS USING INK JET PRINT HEAD AND ALIGNMENT MARKS

(75) Inventors: Christopher Newsome, Cambridge (GB); Takeo Kawase, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 190 days.

(21) Appl. No.: 10/475,449

(22) PCT Filed: Sep. 9, 2002

(86) PCT No.: PCT/GB02/04089

§ 371 (c)(1),
(2), (4) Date: Nov. 19, 2003

(87) PCT Pub. No.: WO03/023878

PCT Pub. Date: Mar. 20, 2003

(65) Prior Publication Data

US 2004/0170762 A1    Sep. 2, 2004

(30) Foreign Application Priority Data

Sep. 10, 2001 (GB) ................................ 0121815.5

(51) Int. Cl.
   *B05D 1/12*   (2006.01)
   *B05D 5/06*   (2006.01)
   *B41J 2/01*   (2006.01)
(52) U.S. Cl. .............................. 427/8; 427/66; 347/107
(58) Field of Classification Search .................... 427/8, 427/66; 347/107
See application file for complete search history.

(56) References Cited

U.S. PATENT DOCUMENTS

| | | | |
|---|---|---|---|
| 4,493,993 A * | 1/1985 | Kanamuller et al. ..... | 250/222.1 |
| 5,404,020 A * | 4/1995 | Cobbs ........................ | 250/548 |
| 5,600,350 A | 2/1997 | Cobbs et al. ................. | 347/19 |
| 5,631,678 A * | 5/1997 | Hadimioglu et al. ......... | 347/46 |
| 5,835,108 A | 11/1998 | Beauchamp et al. .......... | 347/19 |
| 5,850,276 A * | 12/1998 | Ochi et al. ................... | 349/158 |
| 6,003,980 A * | 12/1999 | Sheinman et al. ............. | 347/78 |
| 6,063,339 A * | 5/2000 | Tisone et al. ................. | 422/67 |
| 6,066,357 A * | 5/2000 | Tang et al. .................... | 427/66 |
| 6,097,497 A * | 8/2000 | McGraw ...................... | 358/1.12 |
| 6,304,384 B1 * | 10/2001 | Nishikawa ................... | 359/619 |
| 6,347,857 B1 * | 2/2002 | Purcell et al. ................ | 347/19 |
| 6,450,607 B1 * | 9/2002 | Bolash et al. ................. | 347/19 |
| 2001/0040598 A1 | 11/2001 | Dunand ....................... | 347/16 |
| 2002/0018106 A1 | 2/2002 | Dunand ....................... | 347/74 |
| 2002/0119246 A1 * | 8/2002 | Sakamoto et al. ............ | 427/64 |
| 2003/0020777 A1 * | 1/2003 | Su et al. ....................... | 347/19 |

FOREIGN PATENT DOCUMENTS

| EP | 0 902 315 A2 | 3/1999 |
|---|---|---|
| JP | A 11-2711 | 1/1999 |

\* cited by examiner

*Primary Examiner*—Stephen Meier
*Assistant Examiner*—Rene Garcia, Jr.
(74) *Attorney, Agent, or Firm*—Oliff & Berridge, PLC

(57) ABSTRACT

The invention provides a method and apparatus for depositing a soluble material, such as an organic polymer, onto a substrate using an inkjet print head. The substrate is provided with an array of alignment marks and the material in solution is deposited when substantially aligned with one of the alignment marks to provide an alignment dot of the material in solution. The alignment dot is viewed before the deposited material in solution has dried. Cross-shaped alignment marks are used to facilitate viewing of the positions of the alignment dot.

24 Claims, 10 Drawing Sheets

π* Anti-bonding orbit hυ

π Bonding orbit

O+

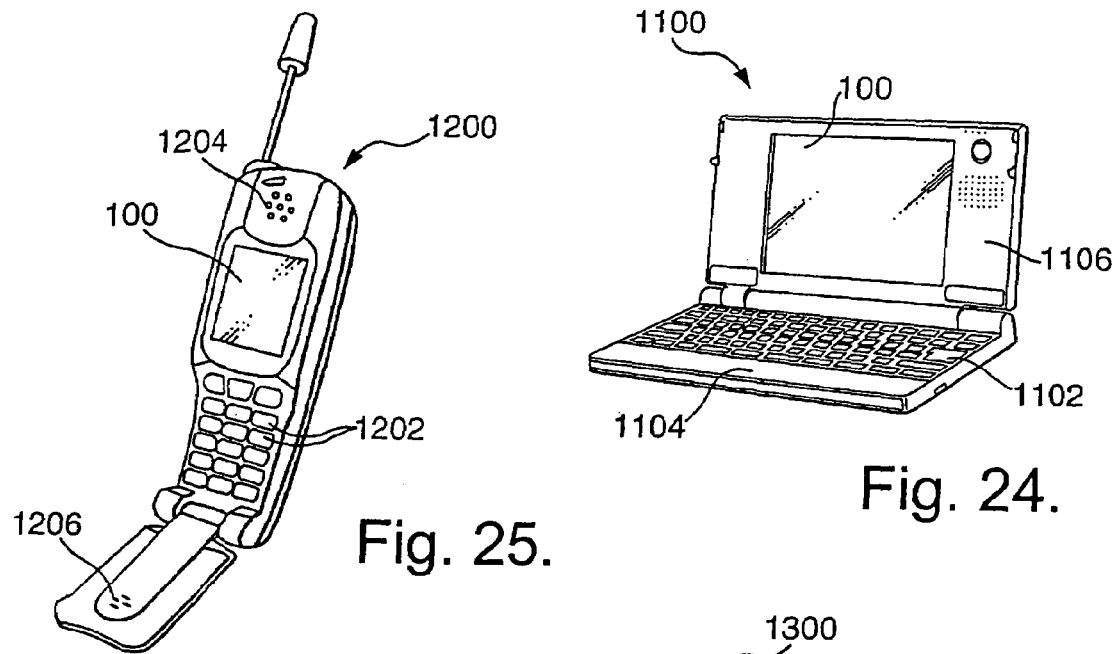
Fig. 25.
Fig. 24.
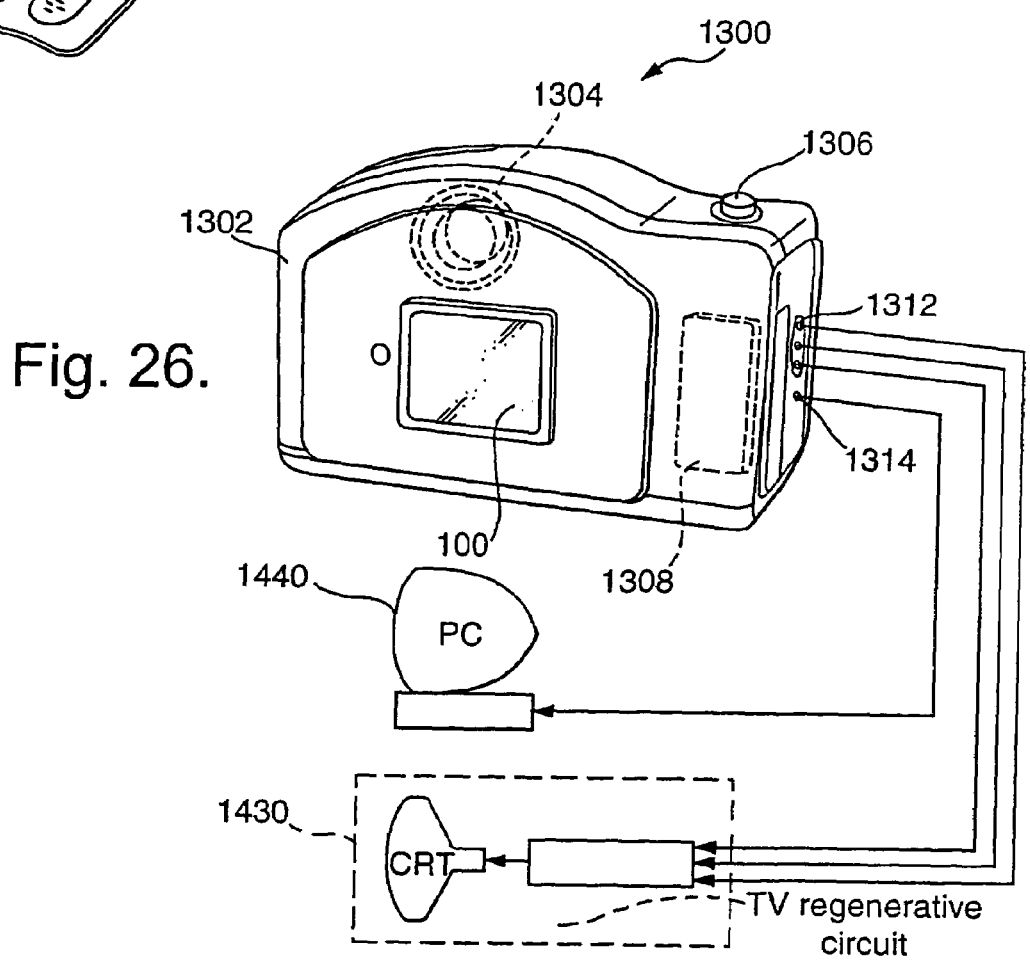
Fig. 26.

DEPOSITION OF SOLUBLE MATERIALS USING INK JET PRINT HEAD AND ALIGNMENT MARKS

BACKGROUND

The present invention relates to the deposition of soluble materials and in particular to the deposition of soluble materials using inkjet technology.

In recent years there has been an increase in the number of products which require, as part of their fabrication process, the deposition of organic or inorganic soluble or dispersible materials such as polymers, dyes, colloid materials and the like on solid surfaces. One example of these products is an organic polymer electroluminescent display device. An organic polymer electroluminescent display device requires the deposition of soluble polymers into predefined patterns on a solid substrate in order to provide the light emitting pixels of the display device. The substrate may, for example, be formed of glass, plastics or of silicon.

In the manufacture of semiconductor display devices, such as light emitting diode (LED) displays, it has been conventional to use photo-lithographic techniques. However, photo-lithographic techniques are relatively complex, time consuming and costly to implement. In addition, photo-lithographic techniques are not readily suitable for use in the fabrication of display devices incorporating soluble organic polymer materials. Concerns relating to the fabrication of the organic polymer pixels have, to some extent, hindered the development of products such as electroluminescent display devices incorporating such materials to act as the light emitting pixel elements. Consequently, it has been proposed to use inkjet technology to deposit the soluble organic polymers in the fabrication of electroluminescent display devices.

SUMMARY

Inkjet technology is, by definition, ideally suited to the deposition of the above soluble or dispersible materials. It is a fast and inexpensive technique to use. In contrast to alternative techniques such as spin coating or vapour deposition, it instantly provides patterning without the need for an etch step in combination with a lithographic technique. However, the deposition of the soluble organic materials onto the solid surface using inkjet technology differs from the conventional use of the technology, to deposit ink on paper, and a number of difficulties are encountered. In particular, there is a primary requirement in a display device for uniformity of light output and uniformity of electrical characteristics. There are also spatial limitations imposed in device fabrication. As such, there is the non-trivial problem to provide very accurate deposition of the soluble polymers onto the substrate from the inkjet print head. This is particularly so for colour displays as respective polymers providing red, green and blue light emissions are required to be deposited at each pixel of the display.

To assist the deposition of the soluble materials it has been proposed to provide the substrate with a layer which includes a pattern of wall structures defined in a de-wetting material so as to provide an array of wells or elongate trenches, bounded by the wall structures, for receiving the material to be deposited. Such a pre-patterned substrate will be referred to hereinafter as a bank structure. When organic polymers in solution are deposited into the wells, the difference in the wettability of the organic polymer solutions and the bank structure material causes the solution to self align into the wells provided on the substrate surface. However, it is still necessary to deposit the droplets of organic polymer material in substantial alignment with the wells in the bank structure. Even when such a bank structure is used, the deposited organic polymer solution adheres to some extent to the walls of the material defining the wells. This causes the central area of each deposited droplet to have, at best, a thin coating of deposited material, perhaps as low as 10% of the material in comparison to the material deposited at the walls of the bank structure. The deposited polymer material at the centre of the wells acts as the active light emissive material in the display device and if the polymer material is not deposited in accurate alignment with the wells, the amount and therefore the thickness of the active light emissive material can be further reduced. This thinning of the active light emissive material is of serious concern because the current passing through the material in use of the display is increased which reduces the life expectancy and the efficiency of the light emissive devices of the display. This thinning of the deposited polymer material will also vary from pixel to pixel if deposition alignment is not accurately controlled. This gives rise to a variation in the light emission performance of the organic polymer material from pixel to pixel because the LED's constituted by the organic material are current driven devices and, as stated above, the current passing through the deposited polymer material will increase with any decrease in the thickness of the deposited material. This performance variation from pixel to pixel gives rise to non-uniformity in the displayed image, which degrades the quality of the displayed image. This degradation of image quality is in addition to the reduction in operating efficiency and working life expectancy of the LED's of the display. It can be seen therefore that accurate deposition of the polymer materials is essential to provide good image quality and a display device of acceptable efficiency and durability.

The requirement to achieve accurate alignment of the print head nozzles with the wells in the bank structure can, in practice, be subdivided into two parts; namely preparation alignment and printing process alignment, this latter alignment being achieved through actual deposition of material.

The preparation alignment may itself be broken down into two stages. The first stage may be termed 'alignment in $\theta$' and this is carried out to ensure that the substrate carrying the bank structure and the translation system carrying the inkjet head are aligned both in the transverse (X) and longitudinal (Y) directions of the substrate. This alignment in $\theta$ is carried out optically by aligning the print head with a first well in the bank structure located at or in the vicinity of a corner of the structure.

The wells in the bank structure may be considered as a matrix array of rows and columns and the print head is positioned firstly at the opposite end of the row in which the first well is located and the alignment of the print head with a second well in the row is checked. This can be referred to as alignment in the X direction. The print head is then positioned over the opposite end of this column containing the first well and the alignment with a further well at this opposite end of the column is checked. This is referred to as alignment in the Y direction. If misalignment is observed the substrate is rotated relative to the head translation system in the plane of the substrate and the above observation process is repeated until optical alignment is seen in both the X and Y directions of the substrate.

There are two main types of inkjet head. One type uses a thermal print head and these are commonly known as bubble jet heads. The second type uses a piezoelectric print head where a piezoelectric device is located behind a diaphragm in communication with a reservoir. In this second type of inkjet head the piezoelectric device is energised and the diaphragm deflects to pressurise the reservoir, forcing the liquid contained in the reservoir, in this case the polymer material in solution to provide the light emissive pixels for a display, out through a nozzle as a fine droplet of the polymer material. With either type of print head, the nozzle has a very small outlet orifice, typically of a diameter of about 30 microns. The organic polymers are usually dissolved in a relatively volatile organic solvent so that they can be deposited in solution.

During deposition, the inkjet print head is maintained as close as possible to the substrate carrying the bank structure. Normally, the inkjet print head is arranged at a separation of about 0.5 mm to 1.0 mm above the substrate. This separation range may also be used to initially check optically the alignment of the print head in θ as described above. The wells in the bank structure are however very small in size so a high magnification microscope is required for this optical alignment check. As high magnification is used, there is very little depth of field in the viewed image and hence, it is usually not possible to have a well in the bank structure and the nozzle of the inkjet head in focus at the same time, which makes it difficult to ensure that the required optical alignment is actually being achieved.

It is also necessary to ensure that the viewing axis is exactly perpendicular to the substrate, otherwise an offset occurs between a well and a nozzle of the ink jet head. This also is very difficult to achieve in practice.

The second stage of preparation alignment may be termed as 'alignment to obtain the origin', the origin being the position where deposition of the organic polymer material is to commence in the fabrication of the display device. However, it can be appreciated from the above concerns that optical alignment of an inkjet head with wells of the bank structure cannot be readily achieved with the required accuracy.

The alignment of origin is therefore usually carried out with actual deposition of one or more droplets of the organic polymer material. The material is deposited into a number of wells in the bank structure and the alignment is checked by subsequently viewing the deposited droplets. However, a number of concerns also arise with actual deposition of material to achieve alignment of origin.

A droplet of material, when dry, has the same wetting property as subsequent droplets being deposited. Hence, if a wet or fresh droplet contacts a previously deposited dry droplet it may be pulled towards the deposition site of the previous droplet, making it. extremely difficult to check the actual deposition site of the later deposited droplet. Furthermore, the droplets of deposited material, when dry, are very difficult to see even with a microscope, because they are very thin and relatively transparent. Also, the wells in the bank structure are substantially circular in shape, as are the deposited droplets. Hence, if a droplet is deposited into exact alignment with a well in the bank structure, it is, in essence, a substantially circular droplet of a relatively transparent material located in a substantially circular shaped well in the bank structure. There is therefore a significant need for an alternative arrangement to check alignment of origin, such as a compact array of alignment marks separate from the wells in the bank structure. If the coordinates between the marks of such an alignment array are known, then this information can be used to apply correction to the deposition head to achieve the origin. Furthermore, if the alignment array is arranged such that the spacing between marks is in the region of between about 2 to about 10 times the size of deposited droplets, several of such marks can be viewed simultaneously in the field of view of the microscope being used to obtain the origin, enabling several deposited droplets to be checked without repositioning of the viewing microscope.

Once the preparation alignment has been completed the actual printing process may commence. However, as will become apparent form the description below, printing process alignment needs to be carried out at regular intervals during actual printing or deposition of the droplets. In inkjet printing the droplets have a flight speed typically in the range of 2 to 10 m/sec. The relative speed between the substrate and print head is typically in the range of 10 to 100 mm/sec. Assuming a droplet speed of about 5 m/sec and a separation of 1 mm between the inkjet head and substrate, the time taken for an ejected droplet to reach the substrate is about 0.2 milliseconds. If the print head has a transverse speed of 100 mm/sec relative to the deposition substrate, an offset of 20 μm will be created between the ejection point and the actual deposition point on the substrate. This offset, if considered in isolation, is regular and equal for all nozzles of the inkjet print head. For conventional printing, in which case the substrate is paper, which is the normal use of this technology, this offset is not problematical because it is the same over the entire printed image and such a small offset in the position of the printed image on the paper is not discernible during normal viewing of the printed data image.

However, with the printing of organic polymer devices, the organic polymers are dissolved in a relatively volatile solvent and some evaporation of the solvent will occur as the solution ejects from the nozzle outlet orifice. Hence, it is common for deposits of the polymer material to form around the orifices of the inkjet nozzles. These deposits tend to form in an uneven fashion and therefore give rise to an irregular profile for the periphery of the nozzle orifice, causing a deflection of the material as it ejects from the print head nozzle. Because of the deflection to the ejected solution, the ejected droplets invariably do not have a perpendicular flight angle relative to the substrate. This gives rise to further but irregular offsets between the desired and actual positions of a deposited droplet on the substrate. Furthermore, the deposits around the nozzle orifice usually vary during the deposition process and likewise, therefore, the offset between the desired and actual deposition sites can also vary in an irregular manner over the period during which the droplets are deposited. There is, therefore, a significant need to repeatedly monitor the deposition of droplets to ensure that the required accuracy of deposition is being maintained during device fabrication. If deposition accuracy is determined as not being maintained the nozzles of the inkjet head must be cleaned of the deposits. This irregular offset between the position of the inkjet head and the deposition site gives rise to a further concern regarding checking alignment of the inkjet head nozzles with the wells in the bank structure.

The inkjet head usually comprises an array of nozzles so that as the head is translated over the deposition area, several droplets of the organic polymer are deposited simultaneously. However, because the build up of deposits is totally random in nature, the irregular offset for a first nozzle of the head may be in one direction (compared to the flight path for the nozzle without any build up of deposit), for example causing the ejected droplet to travel further in the direction of travel of the inkjet head, whilst the deposit at a second nozzle of the head may, for example, cause an offset in a direction opposite to the first direction, i.e. in a direction opposite to the direction of travel of the head. As stated above, there is a regular offset caused by the flight time of a droplet and the speed of movement of the inkjet head. If, for example, the substrate is moving relative to the head, a droplet would actually be deposited to one side of the target well in the bank structure because the well would have moved past the flight path contact point by the time the droplet has traversed the separation gap between the head and the substrate. This is the regular offset referred to above and this can be compensated during initial optical alignment. However, if the regular offset is cancelled by the irregular offset caused by the deposit, and if this particular well in the bank structure is viewed after deposition of a droplet, it would give the impression that there are no alignment concerns because the deposited droplet may appear to be perfectly aligned in its target well in the bank structure, but this is due to the irregular offset which may vary during the deposition process.

However, the irregular offset for the second nozzle is in the opposite direction to that of the first nozzle. Hence, in this second case, the regular and irregular offsets would be cumulative and could provide an unacceptable degree of misalignment between the droplets being ejected from the second nozzle and their target wells in the bank structure, but this unacceptable alignment would not be noticed because the alignment check on the first droplet has indicated that the inkjet head is correctly aligned with the bank structure. These irregular offsets can be particularly problematical in the production of relatively large size electroluminescent display devices, because deposition is required to occur over a longer period of time and there is therefore an increased likelihood of variable offsets.

If the substrate is of a relatively large size further irregular offsets may be introduced due to thermal expansion or contraction of the substrate, such as those arising from changes in the ambient conditions in the deposition zone.

Additional variable offsets may also be caused by bending of the translation system for the inkjet head. As can be seen from FIG. 1, the inkjet print head is supported from a transverse beam which is usually disposed horizontally. The beam, being a physical structure, bends very slightly under gravitational forces. The centre part of the beam will substantially maintain its horizontal disposition so a droplet deposited with the print head positioned at a central location A will maintain a perpendicular flight path $A^1$, as shown in FIG. 2, to the substrate. However, as the print head is translated away from this central part of the beam, such as to position B shown in FIG. 2, it will no longer be supported by a truly horizontal beam so the flight path $B^1$ at this second position B will no longer be perpendicular to the substrate. Hence, if the print head is moved by X cm along the beam, this can give rise to a variation in deposition point of $X+\alpha$ at the substrate, where $\alpha$ is the additional variable offset caused by the slight bending of the beam. This variable offset can be seen to be present even on relatively small substrates and as the substrate becomes larger, the offset becomes even more noticeable because the translation system becomes longer, giving rise to an increase in the deviation from a perpendicular flight path to the substrate.

All of the above offsets may give rise to a variation from the optimum thickness for the organic material in the well in the bank structure, which as stated above, can create non-uniformity in the displayed image and hence, a display of unacceptable image quality.

As mentioned above, a pattern of wells of bank material may be used to physically assist the alignment of the deposited polymer materials. However, polymer material can only be deposited in each well once and the wells ultimately form the active pixels of the display device. Hence, if misalignment does occur to an unacceptable level it is not possible to reposition the ejection nozzle above any particular well of the bank structure noticed as being defective and for a further droplet of the polymer material to be deposited in the defective well. Therefore, if any droplet of deposited polymer material is not in alignment with its respective well, a defective well of polymer material will already have been created on the substrate in the region which ultimately is to provide part of the active area of the final display device, degrading displayed image quality.

There are also significant difficulties associated with the viewing of the polymer material, when dry, as will become clear from the description below. Therefore, there is a significant need to be able to monitor the deposition of the organic polymer material in the fabrication of electroluminescent display devices at, or very shortly after deposition actually occurs. This can be referred to as in-situ viewing.

However, as mentioned above, in-situ viewing of deposited droplets in the wells of the bank structure can present further difficulties because the wells and the deposited droplets are both circular in shape.

However, the organic polymer material can be deposited in each well of the bank structure once only, so if in-situ viewing is carried out and deposited droplets are seen to be out of alignment, the inkjet head cannot be tracked back over an improperly aligned well for a further droplet of material to be deposited in order to correct the misalignment. It has been realised therefore that a separate array of alignment marks can be used advantageously to check droplet alignment both for alignment in origin and during the printing process. If such alignment marks are provided, alignment of origin can be achieved more easily and with improved accuracy and, furthermore, the deposition accuracy can be checked periodically, and any misalignment seen to occur on an alignment mark or sensed as being likely to occur, such as a tendency for an alignment drift between deposition of material on one alignment mark and a subsequent alignment mark, can be used to provide compensatory control to the inkjet head position and provide correction for misalignment before it reaches a condition where it would give rise to defective pixels in the display device.

These marks of the alignment array for use during the printing process can be provided alongside the edges of the active area to be printed and, optionally, they may also or alternatively be provided within the active area to be printed. Furthermore, the alignment marks can be provided with a specific shape to ease in-situ viewing.

According to a first aspect of the invention, there is provided a method of selectively depositing a material dissolved or dispersed in a solution on a first area of a first surface of a substrate using an inkjet print head, the method further comprising providing an array of alignment marks on the substrate, depositing the material onto the first surface of the substrate from the ink jet print head when substantially aligned with one of the alignment marks thereby to provide an alignment dot of the material, and detecting the alignment dot relative to the alignment mark.

Advantageously, the alignment dot of material is viewed as it deposits on the first surface of the substrate.

Preferably, the alignment dot of material is detected prior to the material changing from a wet condition to a dry condition.

In preferred aspects of the invention the alignment marks are provided as a matrix array or a linear array of alignment marks. Preferably, the alignment marks are provided as cross shape alignment marks.

In a preferred form of the invention, the soluble material is selected to comprise a conjugated polymer. Advantageously, the further surface of the substrate is irradiated with light of a wavelength to which the substrate is substantially transparent when viewing an alignment dot of the soluble material in a wet condition.

Preferably, the further surface of the substrate is illuminated such that the alignment dots of soluble material are viewed as bright field images.

When the soluble material comprises a conjugated polymer, the light is selected to have a wavelength which is greater than the wavelength of the absorption edge of the conjugated polymer.

In a preferred form of the invention, the alignment mark(s) is/are provided to have optical contrast but no wettability contrast relative to the substrate.

In a most preferred aspect of the invention, there is provided a method for making an electronic, opto-electronic, optical or sensor device using the method according to the first aspect of the present invention.

According to a second aspect of the invention, there is provided a substrate for use in the method according to the first aspect of the present invention.

According to a third aspect of the present invention there is provided an electronic, opto-electronic, optical or sensor device comprising a substrate according to the second aspect.

BRIEF DESCRIPTION OF THE DRAWINGS

The present invention will now be described, by way of further example only and with reference to the accompanying drawings in which:

FIG. 24 is a schematic view of a mobile personal computer incorporating a display device fabricated in accordance with the present invention;

FIG. 25 is a schematic view of a mobile telephone incorporating a display device fabricated in accordance with the present invention; and FIG. 26 is a schematic view of a digital camera incorporating a display device fabricated in accordance with the present invention.

DETAILED DESCRIPTION OF EMBODIMENTS

Figure 1:
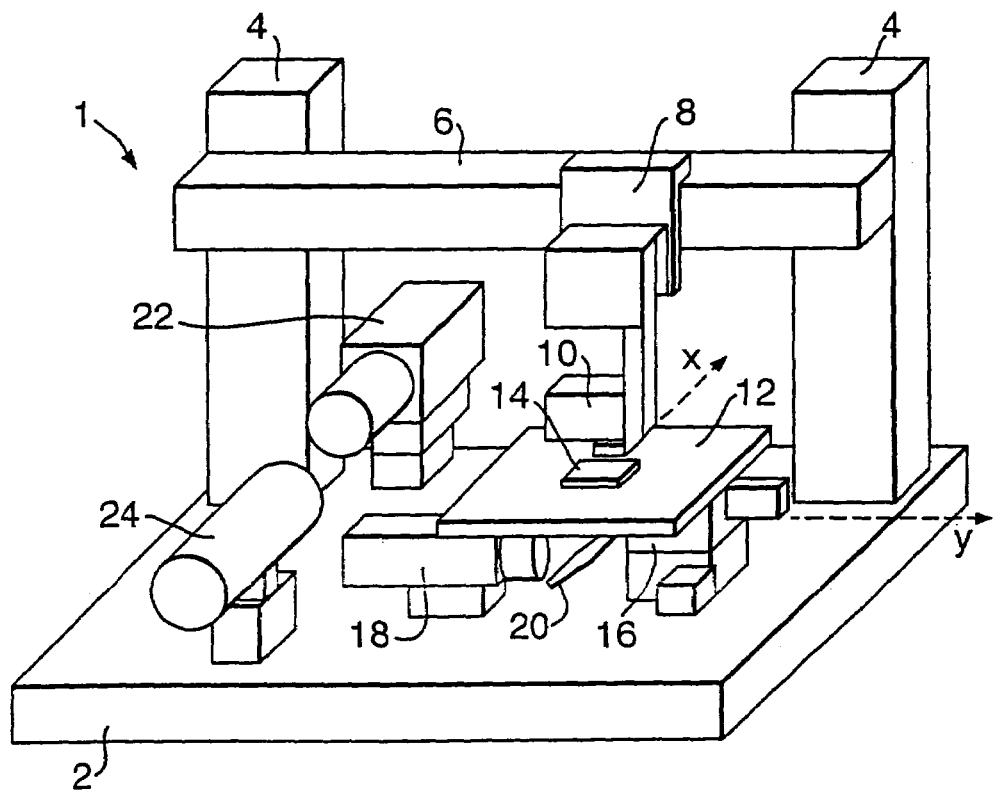
FIG. 1 is a schematic representation of an inkjet deposition machine in which. deposition of a soluble material onto a substrate may be directly observed.
Figure 2:
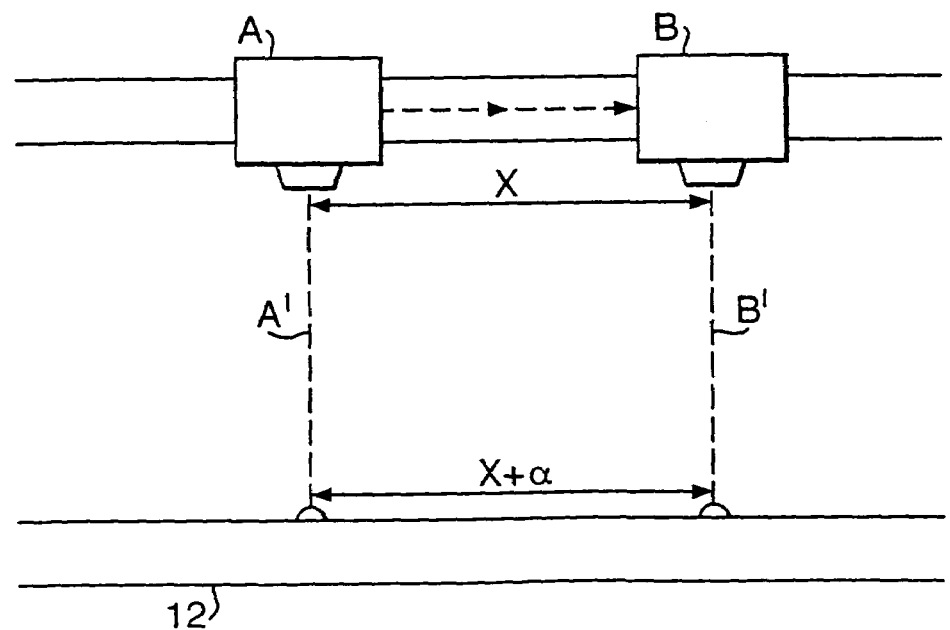
FIG. 2 shows the variable offset which can be produced by bending of the inkjet head translation system of the machine shown in FIG. 1.

Referring to FIG. 1, an inkjet deposition machine 1 comprises a base 2 supporting a pair of upright columns 4. The columns 4 support a transverse beam 6 upon which is mounted a carrier 8 supporting an inkjet print head 10. The base 2 also supports a platen 12 upon which may be mounted a substrate 14. The platen 12 is mounted from the base 2 via a computer controlled motorised support 16 for effecting movement of the platen 12 both in a transverse and a longitudinal direction relative to the inkjet print head, as shown by the axes X and Y in FIG. 1.

In accordance with the present invention, the base 2 also supports a charge coupled device (CCD) microscope 18 which is arranged below and slightly offset from the platen 12 for viewing the lower or under surface of the substrate 14 via a mirror 20. Equally, the CCD microscope could be arranged vertically under and arranged to move in unison with the platen 12, obviating the need for the mirror 20. Optionally, the inkjet deposition machine 1 also includes a second CCD microscope 22 and a stroboscope 24 mounted from the base 2. The carrier 8 is movable along the transverse beam 6 such that the inkjet head 10 can be positioned in the space between the CCD microscope 22 and the stroboscope 24 so that the ejection of droplets from the inkjet head 10 can be observed directly. This is to enable the driving condition of the inkjet head 10 to be tuned for various solutions and polymers which may be required to be ejected on to the substrate 14. As the movement of the platen 12, and hence the substrate 14 relative to the inkjet head 10, is under computer control, arbitrary patterns may be printed onto the substrate by ejecting appropriate materials from the inkjet head 10.

Figure 3:
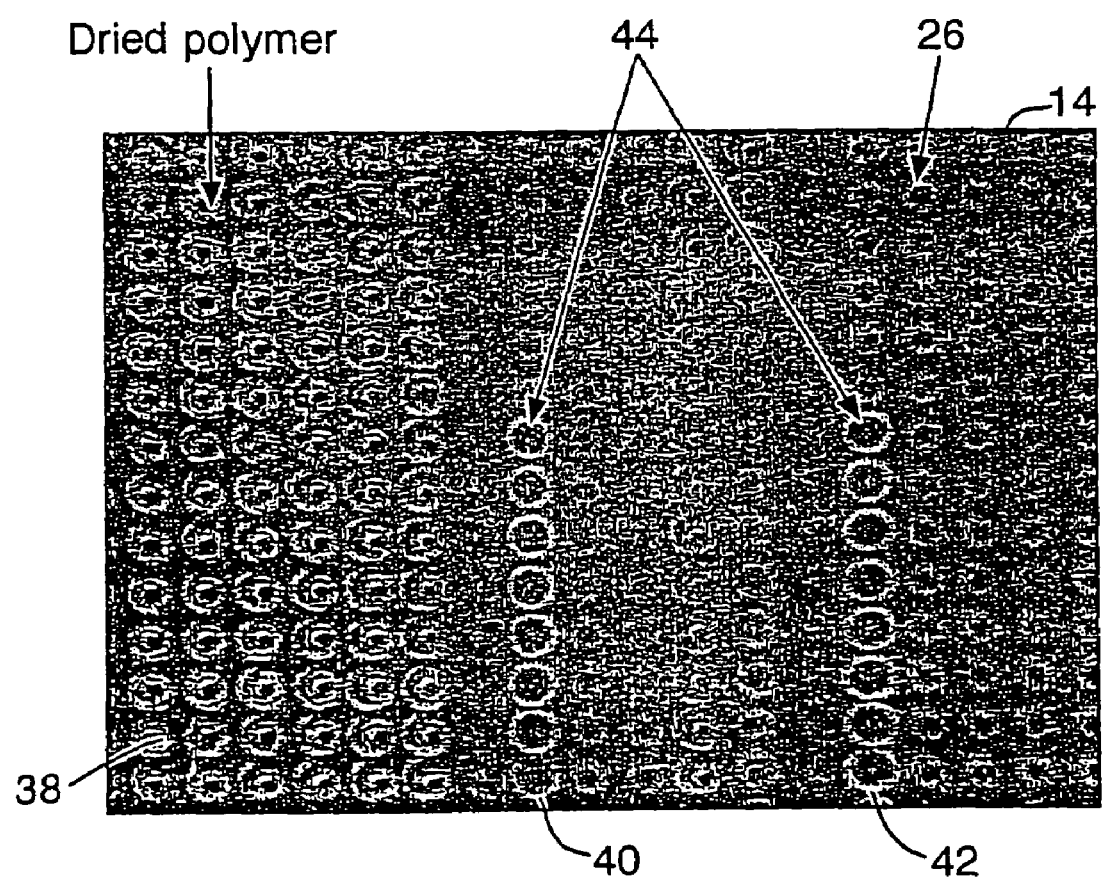
FIG. 3 shows a plan view of part of a substrate having a bank pattern of wells and illustrating examples of dry and recently deposited droplets of polymer material.

FIG. 3 shows an enlarged view of part of the substrate 14. It can be seen from FIG. 3 that the substrate 14 carries a pre-pattern in the form of an array of wells 26 of bank material which receive the organic polymer material ejected from the ink jet head 10. The use of bank patterns is well known in this art and will not, therefore, be described further in the context of the present invention. As will be appreciated, to achieve the required resolution in a display device, the photoluminescent organic polymers, which form the light emitting diodes at each pixel, must be very accurately deposited on the substrate 14. This is particularly so for a colour display, because individual spots of polymer material emitting red, green or blue light must be provided at each pixel of the display to provide a colour image. Typically, in such a display device the organic polymer is a conjugated polymer and may comprise, for example, F8/F8BT/TFB where F8 is [poly19,9-dioctylfluorene)-], F8BT is [poly9,9-dioctylfluorine-co-2,1,3-benzolthiadizole)], and TFB is [poly19,9-dioctylfluorine-co-N-(4-butylphenyl)diphenylamine)].

Figure 4:
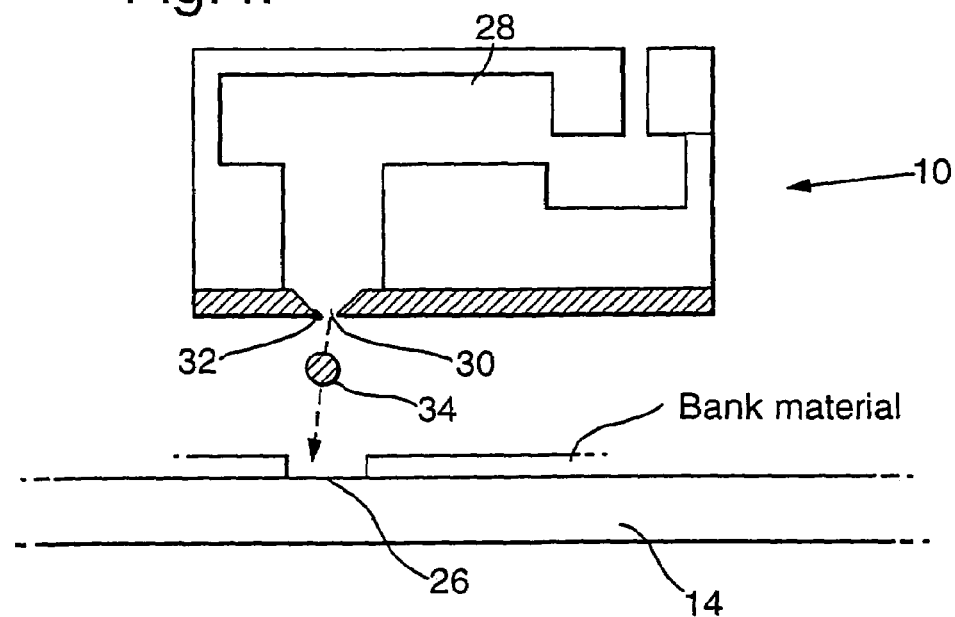
FIG. 4 illustrates schematically an inkjet print head showing the deviation in the flight path of an ejected droplet.

The bank material defining the wells 26 has a de-wetting surface, whereas the wells 26 themselves have wetting surfaces. Relatively good confinement and alignment of the polymer materials can thus be achieved, as can be seen from FIG. 4. However, referring to FIG. 3, the inkjet print head 10 typically comprises a reservoir 28 for accommodating the polymer material to be ejected through a nozzle 30, which, typically, has an ejection orifice of approximately 30 microns diameter. As stated above, for the fabrication of an electroluminescent display device the material to be ejected is an organic polymer dissolved in a suitable solvent, such as Toluene or Xylene. Such solvents are relatively volatile and it will be appreciated that the volume of the ejected droplets is very small, typically in the order of a few picolitres. As the polymer mix is ejected, a bubble of the polymer in solution forms initially at the nozzle 30 due to the surface tension of the solution. As the pressure within the inkjet head increases, the surface tension is overcome and a droplet of the polymer in solution is separated from the nozzle and ejected from the inkjet head. Partial evaporation of the solvent occurs whilst the bubble of solution is in contact with the nozzle causing some of the ejected polymer material to form a deposit 32 at the exit orifice of the nozzle 30. The deposit 32 forms in an irregular fashion and can cause an ejected droplet 34 to follow a non-vertical path, shown by the arrow in FIG. 4, onto the substrate, creating an offset between the actual and the required deposition site, i.e. the well 26. Some clogging of the nozzle 30 is a common occurrence in inkjet heads and to minimise the affect of the non-vertical flight path of the ejected droplets 34, the inkjet print head 10 is maintained as close as possible to the substrate 14 during the deposition cycle. However, a finite separation between the print head and substrate must necessarily be maintained, which gives rise to a deviation or offset between the actual and target deposition sites. Furthermore, in the fabrication of large area displays, flexible plastics sheets or flexible plastics in spoolable roll form can be particularly advantageous. Such flexible plastics substrates may be positioned over a rigid planar surface or may be tensioned in order to present a flat substrate for deposition under the print head. In either case distortion of the substrate has been found to occur and this distortion can vary as the substrate is being moved under the print head. Additionally, such substrates change in physical size with variations in ambient conditions, such as temperature and humidity. All of these factors can also give rise to a deviation or offset between the actual and target deposition sites of the droplets.

It can be seen, therefore, that there is a significant need to monitor the deposition of the droplets of organic polymer material onto the substrate. The accuracy to which droplets have been deposited may be checked by viewing the droplets after deposition onto the bank structure using a suitable microscope. It is also possible to view deposited droplets periodically from the deposition side of the substrate. However, the inkjet head typically consists of an array of ejection nozzles. Because of the physical size of the ink jet head and the objective lens of the viewing microscope, there is necessarily some separation distance between the current droplets being deposited and the droplets being viewed. There is also a considerable time delay between actual droplet deposition and viewing. The droplets are of very small volume and contain a high proportion of volatile solvent. Therefore they dry relatively quickly once deposited. Hence, the deposited droplets have invariably attained a dry or relatively dry condition by the time they can be viewed and are very difficult to distinguish in the bank structure, especially when the deposited materials are transparent.

There is an added concern in viewing droplets deposited into the wells of the bank structure. The droplets can move as they dry. A droplet consists typically of 1% to 5% by volume of organic polymer material, the remaining 95% to 99% being solvent. It can be appreciated therefore that once a droplet has dried the actual material remaining on the substrate is of far smaller volume than the volume of the droplet actually deposited onto the substrate. The material remaining also occupies a much smaller area than the droplet as deposited. If the surface of the substrate is uniform then the material which remains as a dry droplet of organic polymer is usually positioned at the centre of the area occupied by a droplet as deposited. However, if the surface of the substrate includes non-uniformities, which is frequently the case, and particularly for plastics substrates, the polymer material in the deposited droplet can be attracted by a non-uniformity during the drying process. The dried material remaining on the substrate can therefore be disposed to one side or an extremity of the area occupied on the substrate by a droplet as deposited, or it may remain substantially at the centre, depending upon the position of the non-uniformity. Furthermore, the material of the bank structure is chosen so as to provide high wettability contrast with the material being deposited. This wettability contrast is provided to improve the accuracy with which the deposited droplets are aligned with the wells in the bank structure and thus attain their required positions on the substrate. However, the wettability contrast, by way of its required function, influences the position of droplets deposited onto the bank structure. Hence, viewing of a dried droplet in the bank structure is not a true. indication of deposition alignment because, for a particular deposited droplet, the organic polymer material may have "moved" into exact alignment with a target deposition site during the drying process because of the above described influences at the position where the droplet was actually deposited.

It can also occur that this movement of a droplet can give rise to no overlap between the target well in the bank structure and a partially dry deposited droplet, in which case the contrast in the wettability between the droplet and the material of the bank structure is negated, making it more difficult for the droplet to align in the well of the bank structure.

It has been proposed to view deposited droplets in the bank structure by temporarily moving the inkjet head from the area being deposited and then positioning a suitable microscope over the last deposited droplets. However, this proposal has proved problematical because the droplets dry before the microscope can be moved to the viewing position and, as the display size increases, it becomes particularly difficult to determine the position of the last deposited droplets on the substrate. A principal reason for this is that the dry polymer material cannot be distinguished easily from the substrate or bank structure materials.

Furthermore, to repeatedly move the inkjet head away from and back to the deposition location is not efficient and there is no real time monitoring of deposition so feedback on the viewing cannot be maximised.

However, as mentioned above, the polymer material can be deposited in each well of bank material once only so even if deposited droplets are seen to be out of alignment, the inkjet head cannot be tracked back over the badly aligned wells of material for further droplets to be deposited in order to compensate the misalignment.

Furthermore, alignment of origin is usually carried out with actual deposition of one or more droplets into wells of the bank structure. Because the wells of the bank structure are used to form the actual pixels of the display, each well used to check alignment of origin degrades the image quality because the wells used for alignment check cannot be used subsequently to provide light emitting pixel elements. For this reason, the number of wells used for alignment of origin confirmation is usually kept to a minimum and this small number can be found to be insufficient to adequately check alignment of origin. Additionally, the wells in the bank structure and the deposited droplets are circular in shape so even if in-situ viewing is needed for alignment of origin confirmation, the concern of trying to view circular droplets in circular wells continues to be manifest. Furthermore, the wettability contrast of the bank structure material may have a significant influence on a deposited droplet and thus, use of the bank structure can give a false indication of alignment of origin.

Hence, it has also been realised in the present invention that there is a significant need for an array of alignment marks on the substrate, in addition to the bank pattern of wells in which, for example, the active pixels of a display are created, and these alignment marks can be used selectively to monitor in-situ deposition of the polymer material, both during alignment of origin and printing of the pixel elements, and to subsequently control the positioning of the inkjet print head relative to the substrate during the deposition of the polymer materials into the pattern of wells of bank material on the substrate.

Figure 5:
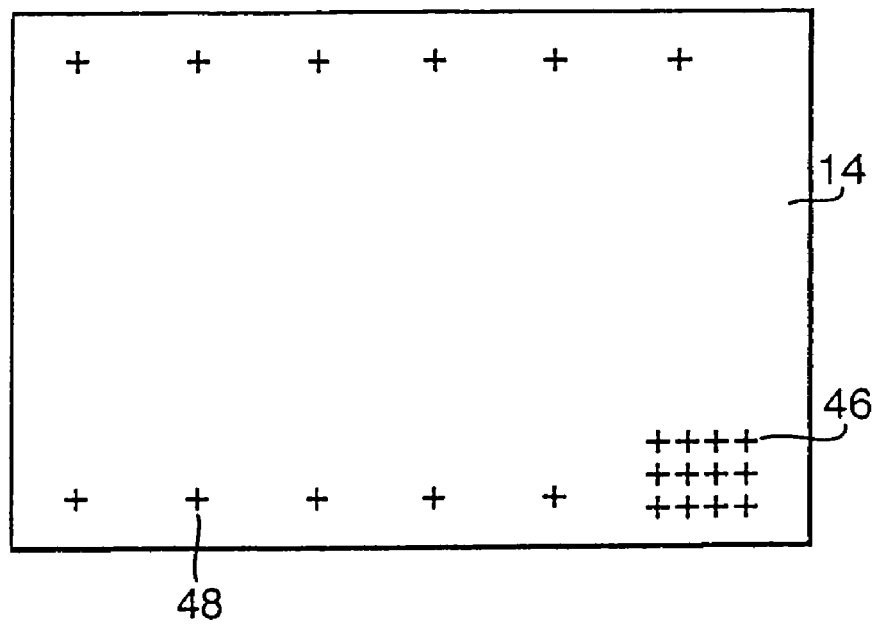
FIG. 5 shows an embodiment of a substrate including alignment marks according to the present invention.

In a preferred form of the present invention, as shown in FIG. 5, the substrate 14 is provided with two arrays of alignment marks, such as a compact matrix array 46; located at or near to the origin on the substrate, and a linear array of alignment marks 48 located along the edge of the substrate and these can be viewed from the underside of the substrate, during actual deposition of polymer material. The linear array 48 of FIG. 5 is shown along both edges of the substrate but, equally, the array may be provided only along one edge of the substrate. Likewise, although a single matrix array 46 is shown, similar matrix arrays may also be provided at other locations on the substrate, such as at or near the corners of the substrate or periodically along the edge of the substrate. Therefore, for large substrates, such as webs of plastics material, several of such alignment arrays may be provided at spaced locations on the substrate.

Figure 6:
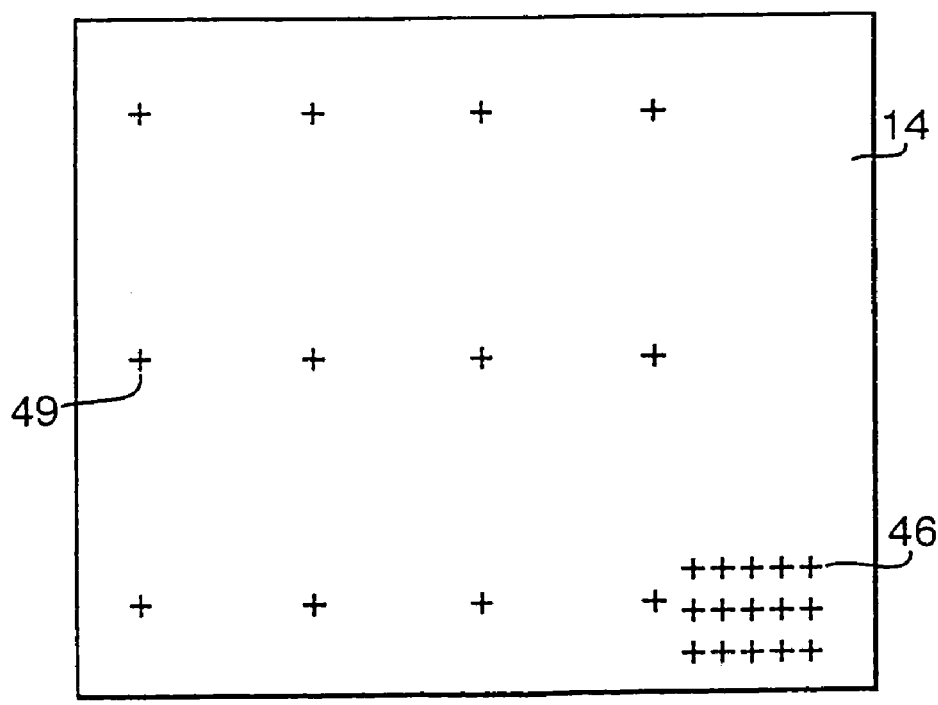
FIG. 6 shows an alternative embodiment of a substrate including alignment marks.

The matrix array 46 has been found to be particularly beneficial for achieving alignment of origin as the array can be provided in a corner region of the substrate outside of that or those areas of the substrate which will be used to provide the display areas of display devices. Furthermore, if the marks of the array are spaced at between about 2 to 10 times the pitch of the wells in the bank structure, the alignment of origin can be easily checked using in-situ viewing. With regard to the linear arrays along the edges of the substrate, these have been found to be particularly beneficial for checking alignment during actual printing of the polymer dots which ultimately will be used to form the active pixel elements of the display device as the alignment can be periodically checked throughout the printing process by moving the inkjet head a short distance so as to overlie one of the linear array alignment marks. One or more linear arrays, such as the array 49 shown in FIG. 6, may also be provided in the central region of the substrate used to provide the display area of the display device.

Figure 7:
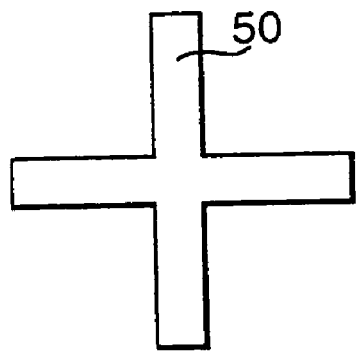
FIGS. 7 to 9 show embodiments of cross shape alignment marks.

It has been found with the present invention that a cross shape alignment mark is particularly suitable for checking alignment, as shown in an enlarged size in FIG. 7. By using a cross shape alignment mark the registration, and hence any unwanted offset, of a deposited droplet can be more easily checked with reference to the cruciform area at the target centre of the cross shape alignment mark.

Figure 8:
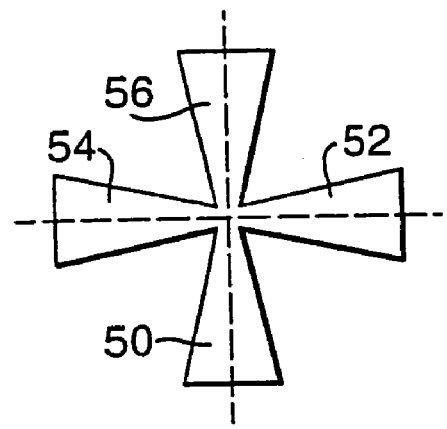

To further assist this alignment process, leg portions 50 of the cross shape marks can be made of tapering shape 52, each reducing in width between distal ends 54 and proximal ends 56, as shown in FIG. 8. A cross shape mark having three leg portions, as shown in FIG. 9, has been found to be particularly beneficial as the central target portion is still apparent but there is less pull on a deposited droplet arising from the three leg portions 50 in comparison to an alignment mark having four leg portions.

Figure 9:
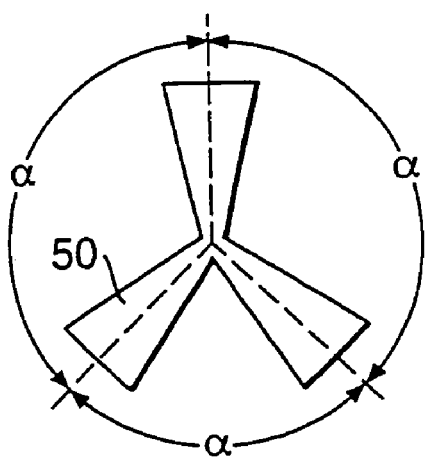

It can be seen from FIGS. 7 to 9 that the leg portions 50 are symmetrically spaced in a circumferential direction about the centre of the mark. Hence, for the three leg mark shown in FIG. 9, the leg portions are mutually spaced at an angle α of 120° in the circumferential direction.

The cross shape marks shown in FIGS. 7 to 9 provide a distinct shape in contrast to the circular shape of a deposited droplet. Furthermore, the leg portions, particularly those of tapering shape as shown in FIGS. 8 and 9, draw visibly towards the centre of the mark whilst also providing visual discernible divisions in a deposited droplet. This makes it far easier to spot misalignment of a deposited droplet with any alignment mark, particularly in comparison to checking alignment of a deposited droplet using the circular wells of the bank structure.

Furthermore, the alignment marks can, unlike the bank structure, be provided of a material which provides high optical contrast with a deposited droplet but low or no wettability contrast with a deposited droplet. Additionally, because the alignment marks can be provided to a specific design, such as the cross-shaped marks described, an image recognition technique can advantageously be used to detect the alignment marks and deposited droplets serving as alignment dots. Any suitable image recognition technique may be used, such as scanning areas of the substrate where the alignment marks are known to be provided and comparing data derived from the scanning process with data stored in a memory, such as a programmable ROM provided in the inkjet machine. Such techniques are well known and will not, therefore, be described further in the context of the present invention. However, it will be apparent that, unlike the bank structure, because the alignment marks can be provided with discernible optical contrast, such an image recognition technique can be used to particular advantage with the present invention and can significantly assist automated checking of alignment accuracy during device fabrication.

The deposited droplets are far easier to detect when in the wet condition, that is between deposition and attaining their dry condition, but are extremely difficult to detect after the dry condition has been attained, and that this characteristic of the deposited droplets of the polymer material can also be exploited to significant advantage with the present invention in order to check the accuracy of deposition of the polymer material.

The polymer material changes quickly to the dry condition after deposition and to exploit this characteristic of the polymer materials in the wet condition, it is advantageous to view deposited droplets of material in-situ; that is, at the time they are deposited, in order to best assess alignment.

The problems associated with viewing deposited polymer material can be more readily appreciated with reference to FIG. 3. If the polymer material has reached its dry condition shown as droplets 38 in FIG. 3 it is difficult to distinguish on the substrate.

However, as can also be seen from FIG. 3, the more recently deposited droplets i.e. those droplets which have not yet attained a dry condition from the wet condition in which they were deposited, are relatively easy to distinguish. It can be seen also from this figure that, of the two rows 40, 42 of more recently deposited droplets, the last deposited droplets 44 are the most visible, the visibility decreasing with an increase of the time since deposition.

The manner in which the deposited droplets are viewed has also been found to facilitate checking of alignment accuracy. It is known that objects can be viewed as 'bright field' or 'dark field' images through the use of appropriate imaging systems.

Figure 10:
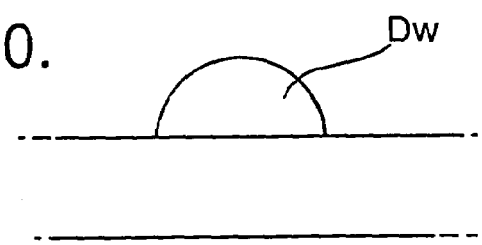
FIG. 10 shows a droplet of polymer material in a wet condition on a substrate.
Figure 11:
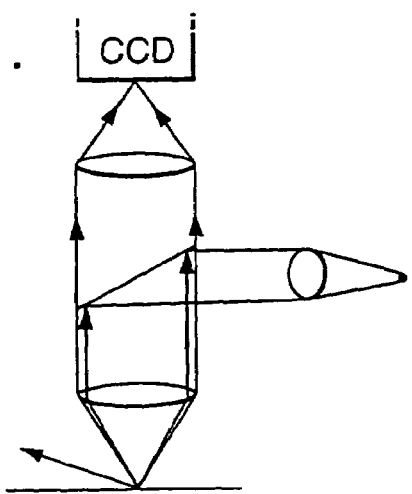
FIG. 11 shows schematically a bright field imaging system.
Figure 12:
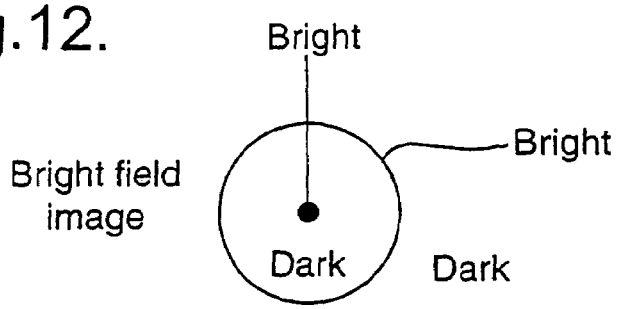
FIG. 12 shows the droplet of FIG. 10 when viewed as a bright field image.

FIG. 10 shows a droplet $D_W$ of polymer material on a substrate in a wet condition. If the wet droplet $D_W$ is viewed by a bright field image optical arrangement as shown in FIG. 11 from the underside of the substrate, light rays from the imaging light source enter the droplet. Those light rays which are not coincident with the centre axis of the droplet undergo internal reflection. However, in the region of the centre axis of the droplet, the upper surface of the droplet is substantially parallel to the substrate. Hence, those light rays passing in the vicinity of the centre axis of the droplet are able to exit the droplet through the upper surface in this region of the centre axis. When the droplet is viewed, therefore, it appears as a very bright spot against a dark circular ground area, surrounded by the bright field background, as shown in FIG. 12. The bright spot at the centre of the image is substantially co-incident with the centre axis of the droplet. This bright field image can therefore be used to advantageous effect to determine the accuracy to which the droplet has been deposited.

Figure 13:
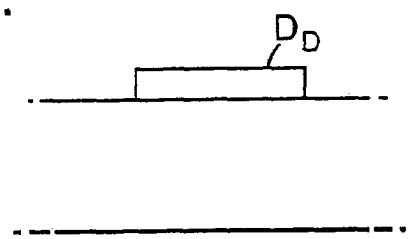
FIG. 13 shows a droplet of polymer material in a dry condition on a substrate.
Figure 14:
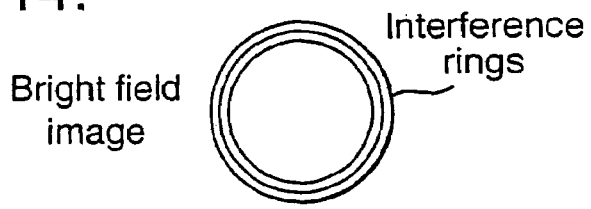
FIG. 14 shows the droplet of FIG. 13 when viewed as a bright field image.

FIG. 13 shows the droplet once it has attained a dry condition, indicated as $D_D$. It can be seen that the hemispherical wet droplet $D_W$ has assumed the shape of a relatively flat thin disc. If a glass substrate, or a plastics substrate having a refractive index similar to glass, is used, the dry droplet has a refractive index which is substantially the same as the substrate material. In this case slight scattering of the light rays occurs which only gives rise to a slight contrast at the edges of the droplet, which is relatively difficult to distinguish. However, if the respective refractive indices of the understructure and the deposited material are different, and if the bright field imaging system shown in FIG. 12 is used to view the dried droplet $D_D$, the light rays pass into the droplet but undergo reflection at the far side of the droplet. The reflected light rays interfere with each other and create interference rings of various colours, the colours being dependent on the thickness of the droplet. This image is shown schematically in FIG. 14. The image shows as coloured interference rings which tend to merge with each other in the viewed image. It is relatively difficult, therefore, to discern a sharp outline for the viewed image. It is readily apparent from a comparison between the wet droplet bright field image shown in FIG. 12 and the dry droplet bright field image shown in FIG. 14, that it is significantly easier to check alignment of the deposited droplet using the image of FIG. 12 than to use the image of FIG. 14.

Figure 15:
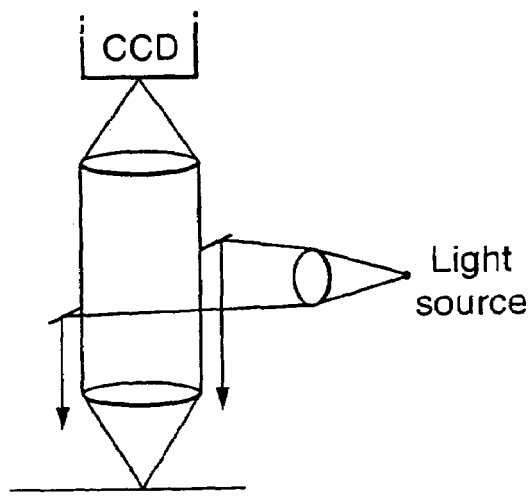
FIG. 15 shows schematically a dark field imaging system.
Figure 16:
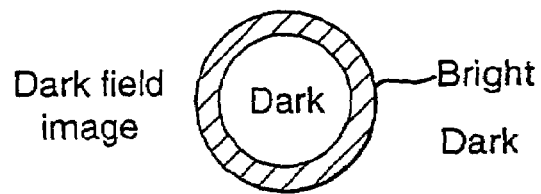
FIG. 16 shows the droplet of FIG. 10 when viewed as a dark field image.
Figure 17:
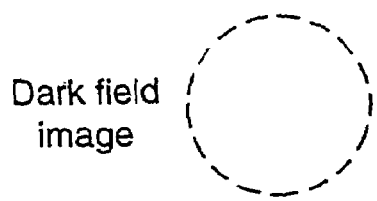
FIG. 17 shows the droplet of FIG. 13 when viewed as a dark field image.

FIG. 15 shows a dark field imaging system, and if the wet droplet $D_W$ shown in FIG. 10 is viewed with this system, light from the light source enters the droplet and undergoes reflection within the wet droplet of material. Some scattering of the light occurs at the edges of the droplet and hence, the wet droplet appears as a bright but well defined annular ring with a dark centre against a dark background. As the bright ring is well defined, the image shown in FIG. 16 is far more beneficial to use to check alignment of the deposited droplet than the bright field image of the dry droplet shown in FIG. 14.

If the dry droplet $D_D$ shown in FIG. 13 is viewed with the dark field imaging system shown in FIG. 15, most of the light impinging on the droplet is scattered and passes outside the field of view of the imaging lens. The dried droplet $D_D$ appears therefore as a very feint circular image against a dark background and this image is very difficult to see and cannot be used to check droplet alignment.

From the above bright and dark field images for the dry and wet droplets, it can be appreciated that significant and unexpected benefits can be provided if the deposited droplets are viewed in-situ whilst they are still in a wet condition. In-situ viewing can be carried out using the apparatus shown in FIG. 1. However, the organic polymer materials are deposited on the upper surface of the substrate, when viewed in FIG. 1 and, hence, for in-situ viewing it is necessary to view deposition of the polymer materials through the substrate. Viewing of the droplets can be made easier if the substrate is illuminated with light. As the materials are viewed through the substrate a first requirement therefore is that the substrate is transparent at the wavelength of the light used for viewing. When the substrate is of glass or transparent plastic, visible light or longer wavelength radiation can be used. When the substrate is made of silicon, infra-red light, whose wavelength is longer than 1.1 microns, is required.

Figure 18:
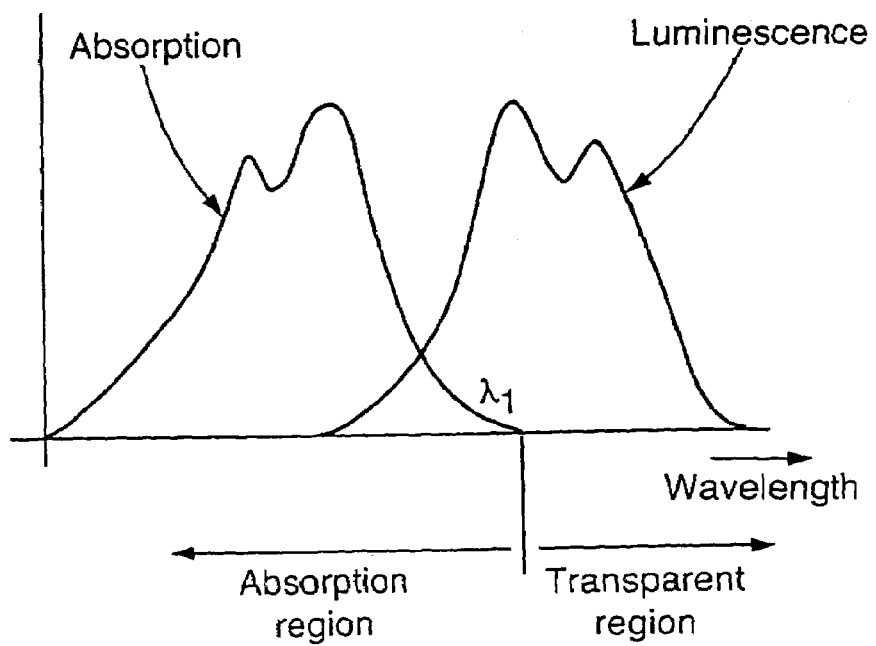
FIG. 18 shows absorption and luminescence characteristics for a conjugated polymer material.

There is also a second consideration for in-situ viewing of conjugated polymers printed by an inkjet technique. The characteristics for absorption and emission (luminescence) of light of a conjugated polymer are shown in FIG. 18. It can be seen from FIG. 18 that there is an overlap region for the absorption and luminescence characteristics. The conjugated polymer will absorb to varying degrees, light incident upon the polymer having a wavelength less than $\lambda_1$. This is indicated as the absorption region in FIG. 18. The conjugated polymer is only transparent to incident light having a wavelength greater than $\lambda_1$ and this is indicated as the transparent region in FIG. 18.

Figure 19:
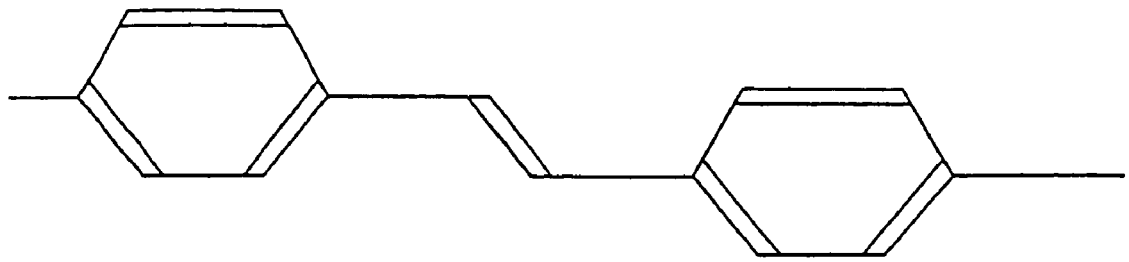
FIG. 19 shows part of the polymer chain for a conjugated polymer material.
Figure 20:
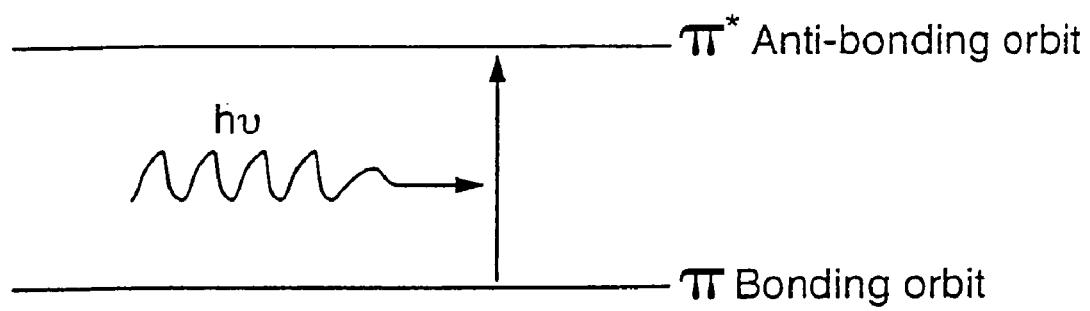
FIG. 20 shows schematically the excitation of electrons of a conjugated polymer under incident radiation.
Figure 21:
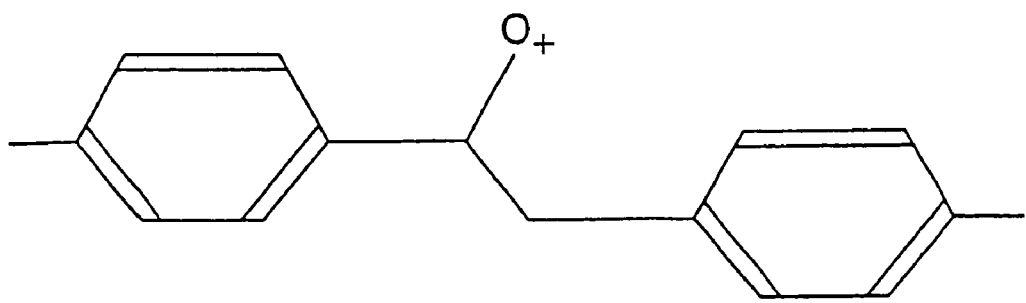
FIG. 21 shows oxidation of the polymer chain illustrated in FIG. 9.

A conjugated polymer chain is shown in FIG. 19 and delocalised π bonding orbit electrons exist along the chain. These electrons have a relatively narrow band gap compared to sigma bonding electrons which also exist in the polymer chain. If the conjugated polymer absorbs Ultra Violet (UV) or visible light, the π bonding electrons are excited from the π bonding orbit (grand state) to a π* anti-bonding orbit (excited state), as shown in FIG. 20. The excited state is less stable than the grand state with respect to the π bonding between atoms. If oxygen atoms are present and this excitation occurs, the π bonding is destroyed and some bonding takes place between the oxygen atoms in the ambient atmosphere and the carbon atoms of the conjugated polymer, giving rise to the photo oxidised polymer chain shown in FIG. 21. This bonding can occur when there are oxygen atoms in the ambient atmosphere of the conjugated polymer and the light to which the conjugated polymer is exposed has a component in the absorption region for the conjugated polymer, i.e. a component having a wavelength less than $\lambda_1$ shown in FIG. 18.

The bonding between the oxygen and carbon atoms degrades the conjugated polymers which gives rise to lower luminance efficiency in LED's and lower charge mobility for organic thin film transistors (TFT's). One option to obviate this polymer degradation is to print the conjugated polymers in an atmosphere which does not contain oxygen. This entails locating the apparatus shown in FIG. 1 in a chamber where the ambient atmosphere within the chamber can be carefully controlled to ensure no oxygen is present. However, this increases process complexity and, furthermore, increases fabrication costs. It is therefore a more realistic proposition to control the wavelength of the light used for in-situ viewing to be in the transparent region of the conjugated polymer, i.e. a wavelength greater than $\lambda_1$ shown in FIG. 18.

When a multi-colour display is manufactured, the red light emitting polymer has the narrowest band gap (longest wavelength for the absorption edge $\lambda_1$). In this case, the light used in the imaging system for in-situ viewing of droplet deposition should not involve a spectral component having a wavelength shorter than the wavelength of the absorption edge for the red light emitting polymer. Furthermore, the silicon detector of the CCD microscope decreases in sensitivity with an increase in the wavelength of the light used and becomes transparent when the incident light has a wavelength of about 1.1 µm. A wavelength of about 900 nm has been found to continue to provide acceptable sensitivity for the CCD. Hence, for a multi-colour display, deep red or infra-red light having a wavelength in the range of about 600 nm to about 900 nm should be used to avoid photo oxidation and therefore degradation of the red light emitting polymer.

Hence, if in-situ viewing of the deposited droplet before the dry condition is used, any offset between the deposited droplet and a well in the bank structure can more easily be seen. Furthermore, as the potential offset in the deposited material can be monitored throughout the duration of the deposition cycle, any increase in offset to beyond a tolerable limit may be quickly detected and appropriate positional compensation between the platen and the inkjet head may be provided by the computer controlled motorised support 16.

Figure 22:
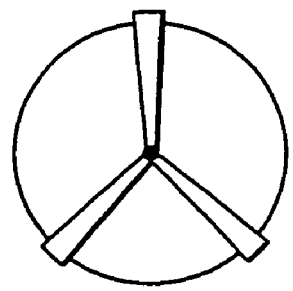
FIG. 22 shows a deposited droplet on an alignment mark as illustrated in FIG. 9 when viewed as a bright field image.

Additionally, if a bright field imaging system is used for in-situ viewing, a bright spot is very discernible at the centre of the bright field image. Hence, if bright field imaging is used to view deposited droplets, the location of the bright central spot relative to the central portion of the cross shape alignment mark becomes very noticeable, facilitating the alignment check. Moreover, because the alignment marks, and particularly those of the matrix array 46 used for origin alignment check, can be spaced advantageously at a pitch at up to 10 times the diameter of deposited droplet, the leg portions can be arranged to be relatively thin but having a length slightly greater than the anticipated radius of a deposited droplet. When in-situ viewing is used, this gives rise to a bright field image against an alignment mark as shown in FIG. 22, making it relatively easy to check alignment. The bright field image in FIG. 22 is illustrated in the same way as the bright field image in FIG. 12.

Referring again to FIG. 1, in use, the ink jet head 10 is fed with an appropriate supply of the polymer material to be deposited. The substrate 14, preferably including an array of wells 26 in the area of the substrate in which the polymer material is to be deposited, is rigidly mounted on the platen 12. The platen 12 is moved in the X and Y axes by way of the computer controlled motorised support 16 and alignment in θ is achieved optically. The inkjet head is then located selectively over one of the matrix arrays 46 and the polymer material is deposited onto the alignment marks of the matrix array to check alignment of origin. The ink jet head is then located over the wells of the bank structure and the polymer material is ejected by the inkjet print head 10 to form the pixel elements of the display. Periodically during the formation of the active pixel elements, the platen 12 is moved under computer control to a position such that an alignment mark 46 of one of the linear arrays 46 is substantially aligned under the nozzle 30 of the inkjet head 10. For example, this may occur each time the polymer material has been deposited in a predetermined number of rows of the wells 26. The deposition of the ejected droplets onto the alignment marks is viewed from the underside of the substrate 12 by the CCD microscope 18 via the mirror 20. As there is in-situ viewing of the deposited droplets before the dry condition is attained, and because a specifically shaped alignment mark is used, any offset between the deposited droplet and the alignment mark can more easily be seen. Furthermore, as the potential offset in the deposited material is monitored throughout the duration of the deposition cycle, any increase in offset to beyond or approaching a tolerable limit may be quickly detected and appropriate positional compensation between the platen and the inkjet head can be provided by the computer controlled motorised support 16. The fabrication of active pixel elements with unacceptable offset can therefore be minimised.

As will be appreciated from the above deposition, the polymer material is deposited onto the upper or first surface of the substrate whereas the actual deposition is viewed from the lower surface of the substrate opposite to the upper surface. The substrate may comprise glass or a transparent plastics material which means that visible light can be used to view the deposition. Equally, the substrate may comprise a silicon or other non-transparent substrate in which case the substrate can be irradiated with light having a wavelength to which the substrate is transparent, e.g. infra-red radiation for a silicon substrate to enable the in-situ deposition to be viewed through the otherwise opaque substrate.

Figure 23:
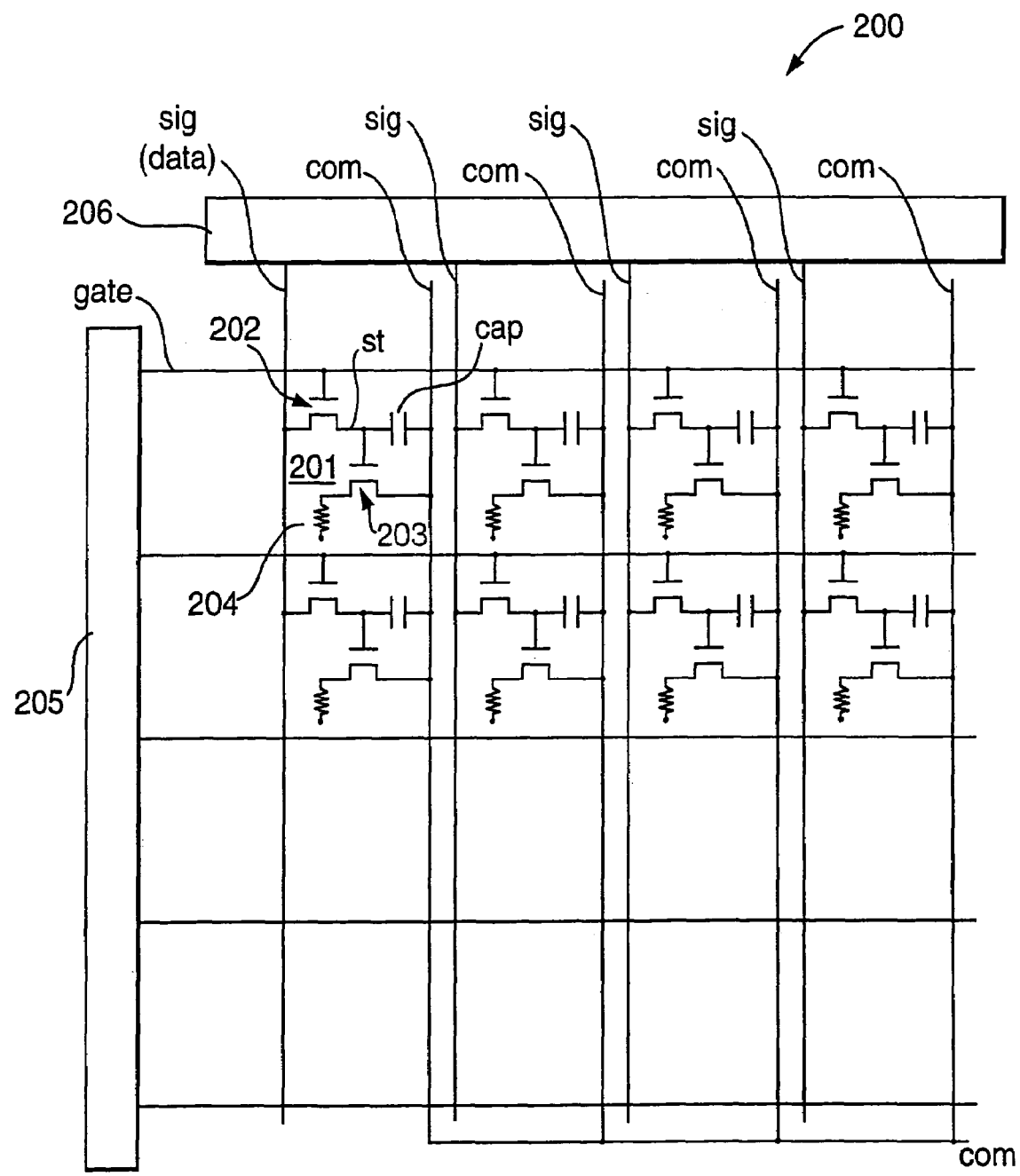
FIG. 23 shows a block diagram of an electrooptic device.

FIG. 23 is a block diagram illustrating an active matrix type display device (or apparatus) incorporating electro-optical elements, such as organic electroluminescent elements as a preferred example of the electro-optical devices, and an addressing scheme which may be fabricated using the method or apparatus of the present invention. In the display device 200 shown in this figure, a plurality of scanning lines "gate", a plurality of data lines "sig" extending in a direction that intersects the direction in which the scanning lines "gate" extend, a plurality of common power supply lines "com" extending substantially parallel to the data lines "sig", and a plurality of pixels 201 located at the intersections of the data lines "sig" and the scanning lines "gate" which are formed above a substrate.

Each pixel 201 comprises a first TFT 202, to which a scanning signal is supplied to the gate electrode through the scanning gate, a holding capacitor "cap" which holds an image signal supplied from the data line "sig" via the first TFT 202, a second TFT 203 in which the image signal held by the holding capacitor "cap" is supplied to the gate electrode (a second gate electrode), and an electro-optical element 204 such as an electroluminescent element (indicated as a resistance) into which the driving current flows from the common power supply line "com" when the element 204 is electrically connected to the common power supply line "com" through the second TFT 203. The scanning lines "gate" are connected to a first driver circuit 205 and the data lines "sig" are connected to a second driver circuit 206. At least one of the first driver circuit 205 and the second driver circuit 206 can be preferably formed above the substrate above which the first TFTs 202 and the second TFTs 203 are formed. The TFT array(s) manufactured by the methods according to the present invention can be preferably applied to at least one of an array of the first TFTs 202 and the second TFTs 203, the first driver circuit 205, and the second driver circuit 206.

The present invention may therefore be used to fabricate displays and other devices which are to be incorporated in many types of equipment such as mobile displays e.g. mobile phones, laptop personal computers, DVD players, cameras, field equipment; portable displays such as desktop computers, CCTV or photo albums; instrument panels such as vehicle or aircraft instrument panels; or industrial displays such as control room equipment displays. In other words, an electro-optical device or display to which the TFT array(s) manufactured by the methods according to the present invention is (are) applied as noted above can be incorporated in the -many types of equipment, as exemplified above.

Various electronic apparatuses using electro-optical display devices fabricated in accordance with the present invention will now be described.

<1: Mobile Computer>

An example in which the display device fabricated in accordance with one of the above embodiments is applied to a mobile personal computer will now be described.

FIG. 24 is an isometric view illustrating the configuration of this personal computer. In the drawing, the personal computer 1100 is provided with a body 1104 including a keyboard 1102 and a display unit 1106. The display unit 1106 is implemented using a display panel 100 fabricated according to the patterning method of the present invention, as described above.

<2: Portable Phone>

Next, an example in which the display device is applied to a display section of a portable phone will be described. FIG. 25 is an isometric view illustrating the configuration of the portable phone. In the drawing, the portable phone 1200 is provided with a plurality of operation keys 1202, an earpiece 1204, a mouthpiece 1206, and a display panel 100. This display panel 100 is implemented using a display device fabricated in accordance with the method of the present invention, as described above.

<3: Digital Still Camera>

Next, a digital still camera using an OEL display device as a finder will be described. FIG. 26 is an isometric view illustrating the configuration of the digital still camera and the connection to external devices in brief.

Typical cameras use sensitized films having light sensitive coatings and record optical images of objects by causing a chemical change in the light sensitive coatings, whereas the digital still camera 1300 generates imaging signals from the optical image of an object by photoelectric conversion using, for example, a charge coupled device (CCD). The digital still camera 1300 is provided with an OEL element at the back face of a case 1302 to perform display based on the imaging signals from the CCD. Thus, the display panel 100 functions as a finder for displaying the object. A photo acceptance unit 1304 including optical lenses and the CCD is provided at the front side (behind in the drawing) of the case 1302.

When a cameraman determines the object image displayed in the OEL element panel 100 and releases the shutter, the image signals from the CCD are transmitted and stored to memories in a circuit board 1308. In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

Examples of electronic apparatuses, other than the personal computer shown in FIG. 24, the portable phone shown in FIG. 25, and the digital still camera shown in FIG. 26, include OEL element television sets, view-finder-type and monitoring-type video tape recorders, vehicle navigation and instrumentation systems, pagers, electronic notebooks, portable calculators, word processors, workstations, TV telephones, point-of-sales system (POS) terminals, and devices provided with touch panels. Of course, OEL devices fabricated using the method of the present invention can be applied not only to display sections of these electronic apparatuses but also to any other form of apparatus which incorporates a display section. Furthermore, the display devices fabricated in accordance with the present invention are also suitable for a screen-type large area television which is very thin, flexible and light in weight. It is possible therefore to paste or hang such large area television on a wall. The flexible television can, if required, be conveniently rolled up when it is not used.

Printed circuit boards may also be fabricated using the technique of the present invention. Conventional printed circuit boards are fabricated by photolithographic and etching techniques, which increase the manufacturing cost, even though they are a more cost-oriented device than other microelectronics devices, such as IC chips or passive devices. High-resolution patterning is also required to achieve high-density packaging. High-resolution interconnections on a board can be easily and reliably be achieved using the present invention.

Colour filters for colour display applications may also be provided using the present invention. Droplets of liquid containing dye or pigment are deposited accurately onto selected regions of a substrate. A matrix format is frequently used with the droplets in extremely close proximity to each other. In situ viewing can therefore prove to be extremely advantageous. After drying, the dye or pigments in the droplets act as filter layers.

DNA sensor array chips may also be provided using the present invention. Solutions containing different DNAs are deposited onto an array of receiving sites separated by small gaps as provided by the chips.

Modifications to the above embodiments can be made whilst remaining within the scope of the invention. For example, the alignment marks have been described as being on the upper or first surface of the substrate onto which the polymer material is deposited. However, the alignment marks may also be provided on the lower or undersurface of the substrate.

Furthermore, the alignment marks have been shown located external to the area 36 in which the polymer material is to be deposited to provide the active pixels of the display device. However, the alignment marks may also be provided at selected locations within the area in which the active pixels are to be formed, such as a linear array of alignment marks spaced along one edge, but within, the area 36. The alignment marks may be fabricated on the substrate during the process for providing the bank structure.

Additionally, whilst the invention is described with respect to viewing the alignment marks from an underside of the substrate, the alignment marks may also be viewed from the upper side of the substrate.

The deposition of material from the inkjet head may be carried out with a head having a single nozzle or an array of nozzles.

Furthermore, when a matrix array of alignment marks are provided and the substrate is provided with a bank structure, the pitch spacing of the alignment dots of the alignment array may be arranged to be n times the pitch spacing between wells of the bank structure, where n is an integer. When an inkjet head having an array of nozzles is used, the pitch spacing of the matrix of alignment marks can be made to corresponding to the pitch spacing of the nozzles so that the deposition performance of a number or all of the nozzles can be checked simultaneously.

The invention claimed is:

1. A method of patterning, the method comprising:
   providing an alignment mark on a substrate and arranging the alignment mark to have optical contrast but no wettability contrast relative to the substrate;
   depositing a droplet including a material dissolved or dispersed in a solvent on a first area of a first surface of the substrate; and
   viewing the droplet deposited on the first surface for checking a deviation between a position of the droplet deposited on the first surface and a position of the alignment mark.

2. A method as claimed in claim 1, the viewing of the droplet deposited on the first surface being carried out by observing the droplet deposited on the first surface from a second surface of the substrate opposite to the first surface.

3. A method as claimed in claim 1, the viewing of the droplet deposited on the first surface being carried out prior to removing the solvent from the droplet deposited on the first surface.

4. A method as claimed in claim 3 wherein the droplet including the material is detected as it deposits on the first surface of the substrate.

5. A method as claimed in claim 1, wherein the droplet is provided on a further area of the substrate external to the first area.

6. A method as claimed in claim 1, wherein a further alignment mark is provided within the first area of the substrate.

7. A method as claimed in claim 1, wherein the alignment mark is provided as a cross shape.

8. A method as claimed in claim 7, wherein the cross shape alignment mark is selected to comprise a plurality of radially extending leg portions symmetrically disposed in a circumferential direction.

9. A method as claimed in claim 7, wherein the cross shape alignment mark is selected to comprise three or four leg portions.

10. A method as claimed claim 1, wherein the alignment mark is selected to comprise a linear array of alignment marks spaced along at least one edge of the substrate.

11. A method as claimed in claim 1, wherein the alignment mark is selected to comprise a matrix array of alignment marks.

12. A method as claimed in claim 1, wherein the alignment mark is selected to comprise one or more linear arrays of alignment marks spaced along at least one edge of the substrate and one or more matrix arrays of alignment marks.

13. A method as claimed in claim 12, wherein the matrix array is selected such that a pitch spacing between alignment marks of the matrix array is n times the pitch spacing between wells of the patterned structure, where n is an integer.

14. A method as claimed in claim 1, comprising:
   providing a patterned structure including an array of wells for receiving the material in the first area of the substrate.

15. A method as claimed in claim 14, wherein the droplet is deposited using an inkjet print head and the inkjet head is selected to comprise a multi-nozzle inkjet head and a pitch spacing between the nozzles is selected to correspond to a pitch spacing between the wells of the patterned structure.

16. A method as claimed in claim 1, wherein an alignment dot of the material is provided periodically by an ink jet print head during the deposition of the material onto the first area of the substrate.

17. A method as claimed in claim 1, wherein the substrate is selected to comprise a rigid substrate of glass, silicon or plastics material.

18. A method as claimed in claim 1, wherein the substrate is selected to comprise a flexible plastics material.

19. A method as claimed in claim 1, comprising:
   selecting the material to comprise a conjugated polymer.

20. A method as claimed in claim 19, comprising:
   irradiating the surface of the substrate with light of a wavelength to which the substrate is substantially transparent when viewing an alignment dot of the material.

21. A method as claimed in claim 20, wherein the light is selected to have a wavelength which is greater than the wavelength of the absorption edge of the conjugated polymer.

22. A method as claimed in claim 1, comprising:
   using an image recognition technique to detect the droplet relative to the alignment mark.

23. A method of making a display device including the fabrication of light emitting elements using the method of claim 1.

24. A method of patterning, the method comprising:
   providing an alignment mark on a substrate;
   depositing a droplet including a material dissolved or dispersed in a solvent on a first area of a first surface of the substrate; and
   viewing the droplet deposited on the first surface for checking a deviation between a position of the droplet deposited on the first surface and a position of the alignment mark, wherein the alignment mark is selected to comprise one or more linear arrays of alignment marks spaced along at least one edge of the substrate and one or more matrix arrays of alignment marks, and further wherein the one of the matrix arrays is selected such that a pitch spacing between alignment marks of the one of the matrix arrays is n times the pitch spacing between wells of the patterned structure, where n is an integer.

* * * * *